United States Patent [19]

Wojnarowski et al.

[11] Patent Number: 4,842,677
[45] Date of Patent: Jun. 27, 1989

[54] EXCIMER LASER PATTERNING OF A NOVEL RESIST USING MASKED AND MASKLESS PROCESS STEPS

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 224,416

[22] Filed: Jul. 26, 1988

Related U.S. Application Data

[63] Continuation-in-part of Ser. No. 152,510, Feb. 5, 1988, Pat. No. 4,780,177.

[51] Int. Cl.[4] ..................... B44C 1/22; B29C 37/00; C03C 15/00; C03C 25/06
[52] U.S. Cl. .................... 156/643; 156/652; 156/659.1; 156/668; 156/902; 219/121.69; 219/121.85
[58] Field of Search ............ 156/643, 652, 656, 659.1, 156/661.1, 666, 668, 345, 902; 29/846; 219/121.69, 121.85; 427/53.1, 54.1

[56] References Cited

U.S. PATENT DOCUMENTS 4,414,059 11/1983 Blum et al. ............... 156/659.1
4,780,177 10/1988 Wojnarowski et al. ........... 156/643

*Primary Examiner*—William A. Powell
*Attorney, Agent, or Firm*—Marvin Snyder; James C. Davis, Jr.

[57] ABSTRACT

A dual layer resist configuration is employed for photopatterning high resolution conductive patterns on underlying polymeric or ceramic substrates, particularly substrates exhibiting surface roughness and non-planar design features such as channels, bosses and ridges. More particularly, a thin underlayer of ablatable photoabsorptive polymer is disposed on a metal coated substrate, after which a thicker layer of substantially transparent material is disposed over the polymer. A beam of laser energy, such as that produced by an ultraviolet excimer layer, is directed through the upper layer and is absorbed by the lower layer which is ablated and simultaneously removes the thick layer above it. This results in the ability to etch high resolution features on polymeric and other substrates, particularly copper coated polyetherimide circuit boards. The resist system is also applicable to VLSI wafers even though such wafers usually do not exhibit surface roughness on the scale generally considered herein. It is also equally applicable in various high density interconnect systems used for the direct connection of chip devices. A mask for patterning and a method for making it are also seen to be desirable because of the high laser energy densities generally desired for thorough ablation. An alternate method is also disclosed which employs two laser exposure steps with the first step being a masked operation on only an ablatable layer and with the second step being an unmasked operation on a dual layer material.

19 Claims, 3 Drawing Sheets

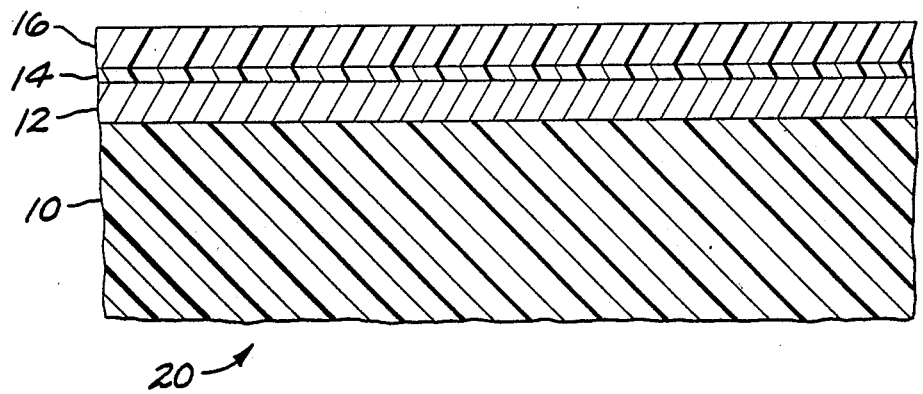
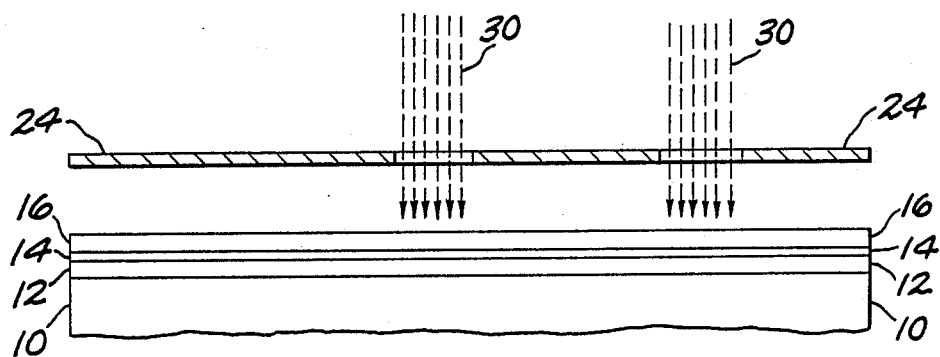
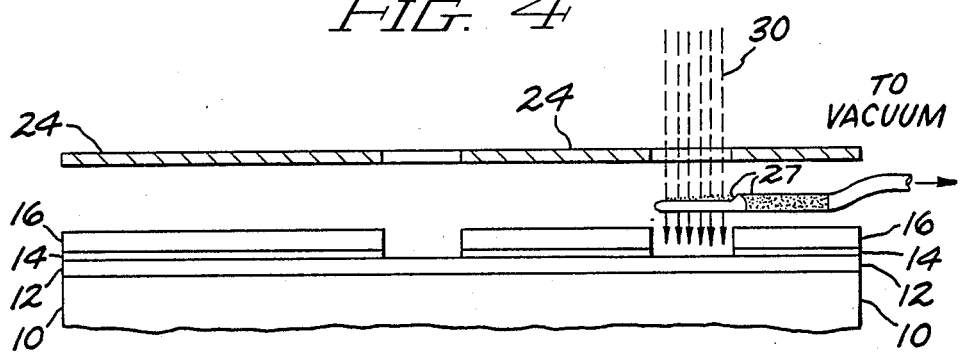

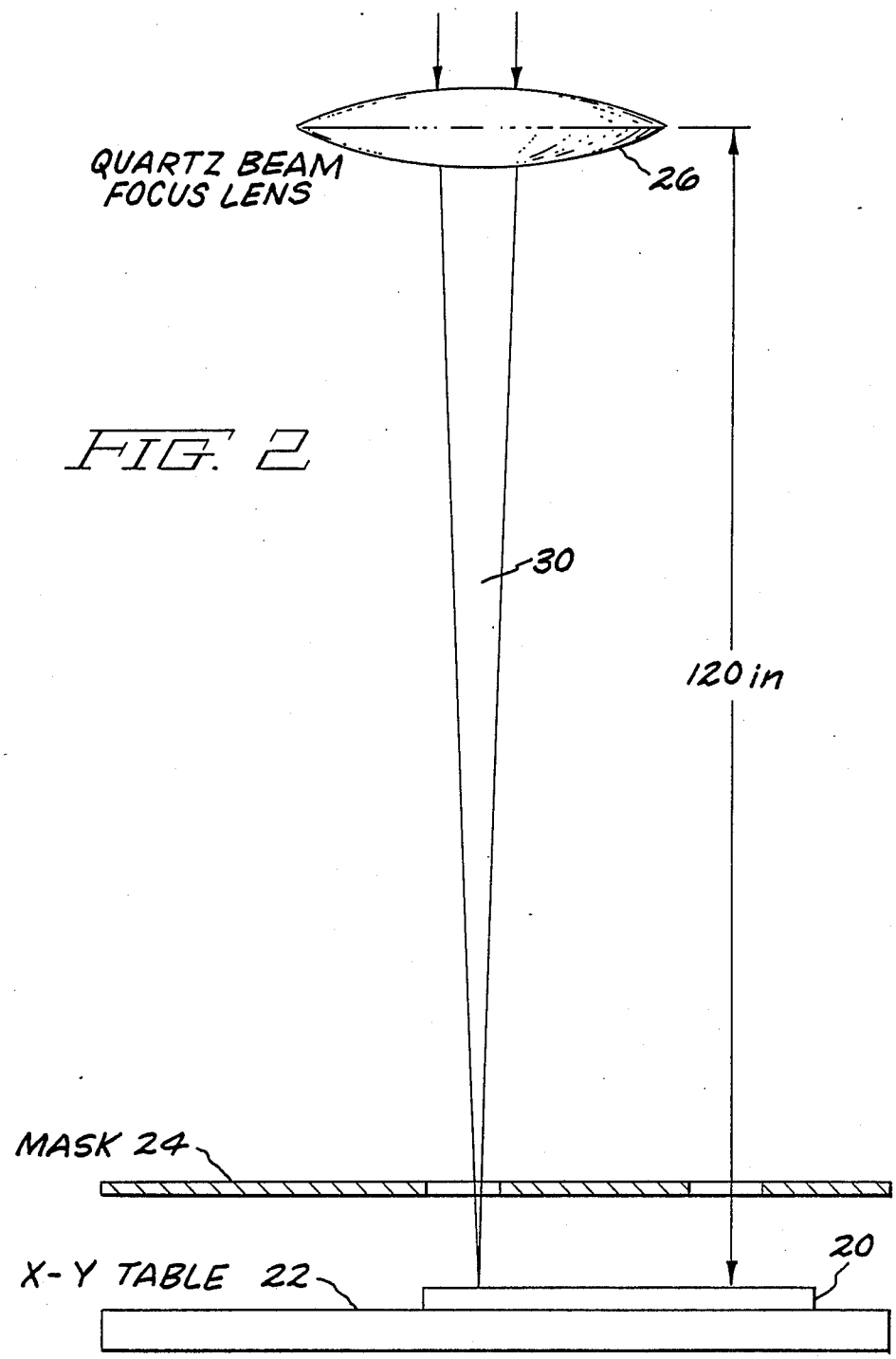

EXCIMER LASER PATTERNING OF A NOVEL RESIST USING MASKED AND MASKLESS PROCESS STEPS

BACKGROUND OF THE INVENTION

This application is a continuation-in-part of application Ser. No. 152,510 filed Feb. 5, 1988, now issued as U.S. Pat. No. 4,780,177, issued Oct. 25, 1988.

The present invention is generally directed to a dual layer photoresist system which is particularly applicable to the formation of high resolution conductive patterns on insulative substrates exhibiting surface roughness and/or non-planar surface variations. More particularly, the present invention is directed to a two level resist configuration and method for photopatterning which employs a thin layer of ablatable photoabsorptive polymer over which is disposed a thicker layer of substantially transparent material which is exploded away during laser ablation of the underlying photoabsorptive layer.

It is nearly impossible to photopattern surfaces exhibiting surface irregularities and/or non-planar aspects, by normal resist methods. Some surface irregularities may occur as a result of the desire to employ filler material such as glass fibers for added strength. Other surface irregularities may occur as a direct result of structural design features incorporated into a molded part. Such features include channels, ridges and bosses, for example. For such workpieces, the use of resist laminates, spin coatings and the like prevent proper resist thickness control and contact maintenance so as to render such resists and processes non-viable.

Moreover, parts patterned using conventional photoresists such as those known in the semiconductor patterning arts are generally fine tuned for use with medium to high pressure mercury arc lamps and do not perform well, if at all, in the presence of collimated, single frequency component radiation such as that produced by lasers, especially ultraviolet lasers. With regard to these conventional resists, a problem exists in that the laser energy is absorbed in the top layer, and once cured, this layer then blinds the surface beneath it, thus rendering the curing of this subsurface material extremely difficult, if not impossible. The resist system and process of the present invention solve these problems and others as is more particularly described below.

In particular, the resist configuration and method of the present invention is directly applicable to the patterning of three-dimensional electronic circuit boards, modules and the like. Additionally, the present invention is also applicable to patterning three dimensional circuit boards and/or surfaces which also include feed-through apertures. As used herein, and in the appended claims, the use of the phrase "three-dimensional" refers to surfaces which are rough, either because of a molding process or because of the use of filler material. This phrase also refers herein to surfaces which exhibit structural design features such as channels, ridges, bosses and the like.

The concept of patterning such three-dimensional boards with a mask with the use of normal light sources is almost impossible. The 1° to 3° diffractions in the light sources, plus lens irregularities make non-contact mask use extremely difficult due to the undercutting of the patterns. Contact mask processes are virtually impossible due to the three-dimensional nature of the surface. Pattern compensations can aid in this problem but edge definition is nonetheless reduced. Furthermore, the use of a standard light source with its associated long exposure time over large areas is prohibitive. For example, it takes minutes to expose large areas with a fixed 500 watt or 1 kilowatt light source.

Points, tips, bosses, etc. of three-dimensional boards cannot easily be coated with resist material in any way. Even sprayed on resists do not work well for this application. Furthermore, films of resist, such as RISTON ™, cannot be roll laminated to such three-dimensional boards. Additionally, there is no easily procurable film resist having a thickness less than approximately 0.7 mils (that is, about 18 microns). In addition, there is none that lasers can expose correctly. In most of the cases of interest herein, a resist thickness of 2 to 3 mils (50 to 75 microns) is needed to cover the surface finish alone. No normal resist is known which can work at these thicknesses with a device such as an excimer laser, for example. Furthermore, the concept of disposing a thin resist which is supported by a clear continuous carrier, such as RISTON ™, which is removed before developing to give the appearance of a thick resist also does not work since the resist layer is confused with the over-layer due to their mutual solubility with respect to one another.

As indicated above, a further area of concern is that the percentage of filler in a polymer substrate, such as one comprising a polyetherimide such as ULTEM ™, makes coating difficult. This aspect plus variations resulting from internal mold finish, make product surface finish variable. Various "pretreats" are, however, employed to promote adhesion. All of the fillers nonetheless produce a very rough surface. Normal resists cannot coat such surfaces, since resists are non-conformable to points, edges, etc. yielding voided areas.

In order to achieve fine line and spacing, one needs a well collimated light source, a good mask and a good, thin resist. There is a direct relationship between the aspect ratio associated with resist thickness and the ability to resolve line and area details. More particularly, the thinner the resist, the greater the ability to resolve fine lines. However, the thicker the resist, the more accurate and precise the radiation source must be. Moreover, the radiation source must exhibit an areal energy density sufficiently high to effect the desired changes in the resist (here ablation). The frequency of the radiation source must also be such that the resist is absorptive at that frequency. Additionally, the mask employed should be able to withstand laser radiation bombardment at the required frequencies without degration in its structure or pattern.

Photoresists that are conventionally used in the semiconductor arts are so absorptive at excimer laser frequencies and energies, that proper exposure is not feasible. Additionally, positive resists are desired whenever through-holes are present. More particularly, if negative resist material dries in the through-holes, such holes cannot be exposed with the laser. This is because the holes are typically approximately 0.1 inches (100 mils) deep and the absorption is 99.99% in the first micron (0.04 mils). In processing, the resist comes out and allows the plated through holes to be destroyed in the etching step. However, positive resists are so-called chain break resists and do not exhibit this problem.

All of the aforementioned problems have made it nearly impossible to make production level three-dimensional parts possessing fine lines and feed-through apertures.

SUMMARY OF THE INVENTION

In accordance with a preferred embodiment of the present invention, a two level resist configuration comprises a thin underlayer of photoabsorptive ablatable, polymer or resist over which is disposed a thick upper layer of substantially transparent material. If the conductive material to be patterned is disposed on a substrate comprising a polyetherimide, then the underlayer preferably comprises material selected from the group consisting of polysulfones. If the underlying supportive substrate comprises a relatively inert material such as a ceramic, then the choice of underlayer material is significantly less restrained and may include polyimides, polyamides and polycarbonates. The upper layer preferably comprises material selected from the group consisting of UV transparent polymers such as polycarbonates, polymethylmethacrylate (PMMA) and polyethylmethacrylate (PEMA) and similar ultraviolet transparent material. Moreover, in preferred embodiments of the present invention, the upper and lower layers exhibit different solubilities with respect to one another so that the upper layer and lower layer are not confused, that is, so that there is a definite and uniform boundary between the upper and lower layers; this enhances the ability of the resist system to form high resolution line patterns. While the resist system of the present invention is particularly applicable to situations involving the patterning of conductive patterns, especially copper patterns, on substrates comprising a polyetherimide such as ULTEM ™ polymeric resin, it is also applicable to other substrates and conductive materials. However, it is also necessary that material employed to strip the layers does not significantly adversely affect the underlying substrate. It is, however, necessary that the upper and lower layer comprise different material or at least similar materials treated to exhibit different photoabsorptive properties so that the lower layer may be ablated and the upper layer simply blown away by the explosive effects of ablation.

Correspondingly, a method for photopatterning conductive patterns preferably comprises the steps of disposing a thin layer of ablatable photoabsorptive polymer on a substrate having a conductive layer thereon so that the polymer material is in contact with the conductive layer. Then a thick layer of substantially transparent material is disposed over the thin underlying polymer. Naturally, photoabsorptivity and transparency are determined with respect to the same frequency range. Then, a beam of incident laser energy is directed through the thick layer so as to ablate the resist layer and so as to simultaneously remove the thick layer directly above the ablated resist layer beneath it. The exposed copper or conductive metal pattern may then be etched. Alternatively, the exposed conductor may be made thicker by electrodeposition methods, after which the polymer and the thick overlayer are removed and the resultant workpiece etched so as to leave conductive material only where it had been built up. In this situation, the use of the upper layer promotes the formation of thick conductive patterns exhibiting highly vertical sidewalls and an excellent aspect ratio.

It is noted that a thin layer of ablatable resist is not employable by itself to achieve the desired results. In particular, in the three-dimensional patterning problem, the resist alone could not act effectively as a mask for the conductive layer beneath it without being so thick that soot and debris from its ablation become prohibitive and tend to defeat the process because soot and debris would tend to fall back onto already exposed conductive surfaces and would tend to coat the mask and ultimately alter its characteristic patterning.

It is also particularly noted that the process of the present invention is preferably carried out using an excimer laser operating in the ultraviolet range and that the thick upper layer is generally approximately 10 times the thickness of the ablatable underlayer. It is also noted that the present invention is preferably practiced using a non-contact mask arrangement. A contact mask arrangement is, however, not generally employable for the present purposes because of debris removal. In the particular case of three-dimensional substrates which include ridges and the like, a contact mask system is virtually impossible and certainly impractical. It is further noted that the present invention is preferably carried out in conjunction with a vacuum debris removal system operating in the vicinity of the ablation site to prevent soot and debris scatter.

Accordingly, it is an object of the present invention to provide a resist and patterning method that enables the manufacture of three-dimensional printed circuit boards from molded or otherwise fabricated parts by means of a highly collimated light source such as an excimer laser.

Another object of the present invention is to provide a dual level resist system that enables the direct patterning of rough surface boards with excimer laser light while still forming fine resolution patterns on the board.

An additional object of the present invention is the formation of a two level resist system useful in the manufacture of other resist related products such as semiconductor wafers and the decaling of metal parts and the like.

It is a further object of the present invention to produce high resolution conductive patterns on a supportive substrate through the choice of underlayer and overlayer materials which are compatible in that the disposition of the one on the other does not cause the formation of confused layers.

It is yet another object of the present invention to immediately pattern without the necessity of development, this being accomplished by the choice of underlayer and overlayer material which is removable by solvents which do not attack the supportive substrate on which the conductive material to be patterned is disposed.

It is a still further object of the present invention to produce a resist system that has a very high latitude for thickness variation, drying, and process conditions and yet is still associated with ease of removal without dissolving or damaging an underlying supportive substrate.

It is also an object of the present invention to provide removal of ash, soot and debris from the ablation process.

Lastly, but not limited hereto, it is also an object of the present invention to provide a resist system that requires minimum exposure from an incident laser beam, this latter being accomplished due to the thinness of the underlayer which absorbs the beam energy in comparison to the second, transparent layer which masks and shields and is removable without adversely affecting a supportive substrate.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a cross-sectional side elevation view of the resist system of the present invention in place on a conductor coated substrate;

FIG. 2 is a partial cross-sectional side elevation view illustrating the practice of the present invention;

FIG. 3 is a cross-sectional side elevation view illustrating the impingement of laser light on the resist system of the present invention through a mask; and FIG. 4 is a cross-sectional side elevation view similar to FIG. 3, but more particularly illustrating the employment of vacuum means for removing debris created by the ablation process.

DETAILED DESCRIPTION OF THE INVENTION

Figure 5A:
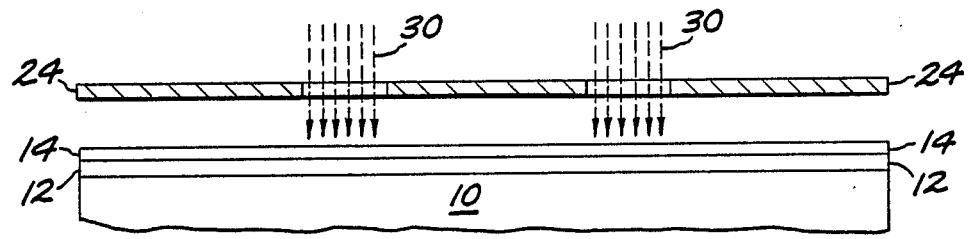
FIGS. 5A through 5D illustrate an alternate embodiment of the present invention using masked and maskless steps.

FIG. 1 illustrates, in a cross-sectional side elevation view, a portion of a workpiece 20 processed in accordance with the present invention. For example, substrate 10 on which is disposed a conductive layer 12, may comprise a polymeric material which is particularly advantageous for use as a substrate in a printed circuit board which is readily moldable. Substrate 10, which may, for example, comprise a material fabricated from ULTEM TM polymeric resin, may also preferably contain filler material such as glass fibers for added strength. Typically, the added glass fibers possess a length approximately 10 times their diameter. The inclusion of such fillers, although desirable for strength, increases the surface roughness. It should also be noted that during the process of patterning conductive layer 12, which typically comprises a material such as copper, it is highly desirably that substrate 10 not be damaged in the patterning of conductive layer 12 and that upper layer 16, discussed more thoroughly below, not be adversely affected by the conductor etchant.

In certain circuit board fabrication processes, particularly those employing fibrous filler material, palladium seeding is used. However, palladium material is prone to migration along fiber induced paths in the polymer substrate. The palladium material can lead to the formation of undesirable conductive pathways between otherwise insulated conductive patterns, as, for example, by electromigration. However, it is possible to convert this palladium material to a non-conductive compound. This process is compatible with the present invention and is desirable when palladium seeding is employed, but forms no part of the present invention.

For the practice of the present invention, it is seen in FIG. 1 that conductor coated substrate 10 includes a dual layer resist configuration. First or underlayer 14 comprises a thin layer of ablatable, photoabsorptive material. In particular, when the underlying substrate comprises a polyetherimide such as ULTEM TM polymeric resin, underlayer 14 preferably comprises a polysulfone. This layer is preferably between about 0.1 microns and about 10 microns in thickness. The resist system also includes thick upper layer 16 of substantially transparent material. In particular, in preferred embodiments of the present invention, it is desirable that upper layer 16 be transparent to radiation produced by excimer lasers in the ultraviolet range and that underlayer 14 exhibit absorptive properties in this frequency region so that the underlayer is ablatable. It is also preferred that upper layer 16 be between about 1 micron and about 100 microns in thickness. In the practice of the present invention, underlayer 14 is ablated and upper layer 16 is blown away during the ablation process. It is also desired that upper and lower layers 16 and 14 exhibit differential solubilities so that the upper and lower layers are not confused by the application of upper layer material to lower layer material.

FIG. 2 illustrates one method of practicing the present invention with respect to the patterning of the resist system described herein. More particularly, it is seen that a pulsed laser beam, as from an excimer laser, is focused with a quartz beam focus lens 26 so as to produce beam 30 passing through mask 24 and impinging upon workpiece 20 which is disposed on X-Y positioning table 22. Although not visible at the scale shown in FIG. 2, workpiece 20 (as is more particularly seen in FIG. 1) contains the dual resist system described herein.

While FIG. 2 shows a lens system for concentrating laser produced radiation, lens arrangements are not necessary for the practice of the present invention. With sufficiently powerful lasers, a concentration mechanism is not required. However, such lasers are generally expensive. Accordingly, it is sometimes desirable to use the dual layer resist system of the present invention with concentrating optics; more particularly, it is possible to move the beam over the surface in a boustrophedonous manner to achieve the desired coverage. Thus, the X-Y positioning table shown is optional, particularly if an optical beam scanning mechanism is employed. It is only important that the beam and workpiece move relative to each other. Also, depending on the resolution desired for the conductive patterning, the mask itself is also optimal.

With respect to the mask itself, some special considerations should be noted particularly as a result of the high energy density present in the radiation beam. In particular, the mask preferably comprises a quartz substrate on which is disposed desired patterning in the form of a reflective, as opposed to an absorptive metal. Desirable metals for this purpose include aluminum and silver. Dielectric coating can be deposited, but are difficult to apply and expensive. Aluminum masks have been employed and have been found to work. In one embodiment, a mask comprised a quartz substrate about 100 mils in thickness. The quartz substrate included a patterned layer of titanium about 1,000 angstroms in thickness. The titanium facilitates adhesion of a reflective metal layer above it. Over the patterned titanium layer a layer of aluminum was disposed which was about 25,000 angstroms thick. Such masks should be employed with the patterning being disposed closer to the radiation source than to the workpiece. Thus, any debris which happens to be deposited on the mask can be wiped off easily without physically contacting the delicate pattern layer.

A mask which is particularly applicable for use in the present invention may be produced as follows: a quartz substrate is thoroughly cleansed in a mixture of 50% concentrated sulfuric acid and 50% hydrogen peroxide or other oxidizer. In the case of a mixture comprising 50% concentrated sulfuric acid and 50% hydrogen peroxide at a solution concentration of approximately 30% and immersion time of approximately 20 minutes has been found to be satisfactory, during which time the solution fizzes actively and is particularly effective for removing organic contaminants. The quartz substrate is then thoroughly rinsed in water and processed through a standard VLSI plate washer. The cleansed and rinsed substrate is then disposed in a vacuum system at a temperature of approximately 50° C. for two hours. This time appears to be a minimum time for satisfactory results. Next, a thin layer of titanium is deposited on the quartz substrate, as for example, by electron beam evaporation. The titanium layer is preferably approximately 1,000 angstroms thick. The titanium is found to be particularly desirable for improved adhesion to the quartz material. Next, a reflective metal layer is deposited. Aluminum or silver is effective for this purpose. For example, in one embodiment, a layer of aluminum approximately 25,000 angstroms thick was employed. The reflective metal and titanium layers are then patterned by standard photolithographic methods. In general, the reflective metal layer is preferably between about 20,000 and 25,000 angstroms in thickness.

FIG. 3 provides a more detailed view of the operation of the present invention than the overall view shown in FIG. 2. FIG. 4 is similar to FIG. 3 except that it illustrates a vacuum system for removal of debris 27 produced during ablation of layer 14 and the subsequent "blowing away" of thicker layer 16. It is noted that the use of ablatable material 14 in a thick layer by itself is not adequate to solve the problem of patterning three-dimensional parts as described herein. More particularly, it is seen that the soot and debris produced by the ablation of a thick layer of resist material would actually be deleterious to the patterning process. However, it is noted that in the operation of the present invention, upper layer 16 is not ablated, but rather is blown away, that is, it is lifted by gas formation resulting from the ablation of photoabsorptive layer 14. While the system of debris removal shown is a vacuum system, it is also possible, though less desirable, to blow the soot and debris away from the ablation site. While workable, this does not afford desirable levels of soot and debris control. This is best achieved with a vacuum system. In particular, in experiments carried out in support of the present invention, a specially fabricated vacuum nozzle was employed which partially surrounded the incident laser beam and was able to minimize debris problems.

In accordance with the present invention, printed circuit boards comprising a polyetherimide such as ULTEM TM polymeric resin were employed. These boards were then palladium seeded and electrolessly plated to provide a copper surface coating of approximately 25 microns in thickness. As described above, "palladium kill" treatments are employed to reduce shorting effects that can occur with palladium seeding. Such printed circuit boards are then baked for adhesion promotion and are now ready for resist deposition. However, tarnish on the copper from the bake is preferably scrubbed off using a standard printed circuit board cleaner method using Scrub Cleaner No. 11 (as supplied by the Shipley Company of Newton, Mass.) and a brush.

Such boards are then rinsed and dipped in methanol and spun dried and then oven dried. The parts are then sprayed with a mixture of polysulfone and O-dichlorobenzene. A mixture of 2.5% UDEL TM 1700 polysulfone (as supplied by the Amoco Chemical Company) was employed. The parts were then air dried at room temperature for approximately 5 minutes and then placed in an oven at a temperature of 140° C. for 5 minutes. The parts were then cooled to room temperature. Polysulfones are inert with respect to methylmethacrylate materials such as KRYLON TM (as sold by E. I. DuPont de Nemours Company) at least partially as a result of their different solubilities with respect to each other. The workpieces are now ready for application of the upper, thicker layer of the resist system of the present invention. The upper layer may be applied using a totally spray process or a combination of dip and spray process steps to ensure complete coverage of plated through-holes, if they are present. The workpieces used in the present example were in fact of the plated through-hole variety. A solution of 20% KRYLON TM by weight in methanol as a dip vat was employed. The KRYLON TM employed was KRYLON TM Clear-150, a product of the Borden Company. The workpieces are immersed and swished in the dip vat to ensure that no bubbles occur in the through-holes. The workpiece is slowly withdrawn at a rate of approximately 10 inches per second for a three inch workpiece. Parts are then set aside to allow even drying and are then placed on a rack for drying at room temperature for approximately 5 minutes. The parts were then oversprayed with another mixture of KRYLON TM Clear-150. It is to be noted that polymethylmethacrylate (PMMA) or polyethylmethacrylate (PEMA) or any other ultraviolet transmissive coating could be used as long as differential radiation transmission properties and solubilities are maintained. Polymethylmethacrylate is a generic polymer available from many sources including the Aldrich Chemical Company.

In one example carried out in accordance with the present invention, the KRYLON TM overspray layer comprised a mixture of 400 grams of KRYLON TM-150, 175 grams of toluene, 125 grams of xylene and 50 drops of BE-173 (a flow control agent supplied by the Nazdar Corporation of Chicago, Ill.). The workpieces were sprayed on both sides, dried at room temperature for approximately 5 minutes, dried at a temperature of 50° C. for 5 minutes and then at a temperature of 90° for 10 minutes, then at a temperature of 160° C. for 30 minutes and then finally cooled to room temperature. The KRYLON TM upper layer merely dries over the UDEL TM polysulfone layer without disturbing it because of their mutual solubility characteristics.

The workpiece is now ready for ablation by a focused laser beam or by a more powerful unfocused laser beam. A focused excimer laser operating at a wavelength of 308 nanometers and employing unstable optics for high collimation and minimum divergence was employed. A Questek 2860 laser was used having a 1×2 centimeter rectangular beam at 180 millijoules at a pulse rate of 80 Hertz focused through a 4 meter quartz lens at 120 inches to increase the power density desired for clean ablation. The spot size was approximately 8.7 millimeters by 4.7 millimeters. An X-Y programmable positioning table that held the pattern mask in place was employed. The programmable positioning stage held the mask and the workpiece. The vacuum particle remover was held stationary in close proximity to the actual ablation site. Two passes were employed over sensitive three-dimensional areas to ensure clear ablation. When the workpiece is scanned, the excimer laser beam selectively ablates off all resist except where copper is desired (at least in one embodiment).

It is noted that the resist method of the present invention may be employed in two different ways. In particular, thin conductive layer 12, approximately 1 to 3 microns in thickness, which is exposed by the ablation process described herein may thereafter be built up selectively by electrodeposition processes after which the resist layers are removed and an etching step is performed to remove the thin conductive layer not exposed by the resist. This is a positive deposition system. This method has the advantage of producing conductive patterns exhibiting steep vertical walls.

However, it is also possible to employ the resist and method of the present invention in a negative deposition system in which the exposed copper is etched, the resist material is removed and, if desired, electroless deposition is selectively carried out to build up the remaining conductive patterns. Copper etching and electrodeposition methods for selective buildup are well known in the art. It is further noted though that metals such as nickel may also be employed as conductive layer 12.

When the conductive layer to be patterned comprises copper, ferric chloride is a desirable etchant. Thin, base layers of copper may be removed in a ferric chloride bath by immersion for about 90 seconds at a temperature of about 40° C.

When the underlying substrate supporting the conductive layer comprises a polyetherimide such as ULTEM TM, it is important that materials used to remove the thick and thin polymer or resist layers be compatible with the substrate. This is particularly true for the solvent used to remove the thick layer. For example, the ablated part is preferably dried for about two minutes at a temperature of about 90° C. The part is then preferably washed in acetone for about five minutes and then in a half and half mixture of cyclohexanone and xylene(s). This is preferably followed by a one minutes wash in acetone after which an acetone spray rinse is applied to the board to remove anything remaining of the two levels. The board is then dried and ready for use, as a printed circuit board, for example.

When the underlying substrate comprises relatively inert material such as a ceramic, the range of solvents useful for removing a polysulfone layer is increased. Suitable solvents for polysulfone in this situation include acetophenone, chloroform, cyclohexanone, chlorobenzene, dimethylforanide, dioxane, methylene chloride and tetrahydrofuran. Blends of solvents which are suitable for this purpose include toluene/cyclohexanone, toluene/acetone, xylene/cyclohexanone and toluene/acetone/cyclohexanone. See Table I below for the relevant solvent weight ratios.

TABLE I

| Solvent Blend | Wt. Ratio of Solvents | % Solids |
|---|---|---|
| Toluene/Cyclohexanone | 50/50 | 20 |
| Toluene/Cyclohexanone | 75/25 | 20 |
| Toluene/Acetone* | 70/30 | 30 |
| Toluene/Acetone/Cyclohexanone | 65/25/10 | 20 |
| | | 25 |
| | | 30 |
| | 35/15/50 | 20 |
| Xylene/Cyclohexanone | 50/50 | 20 |

*Cannot be diluted below 30% solids

Figure 5B:
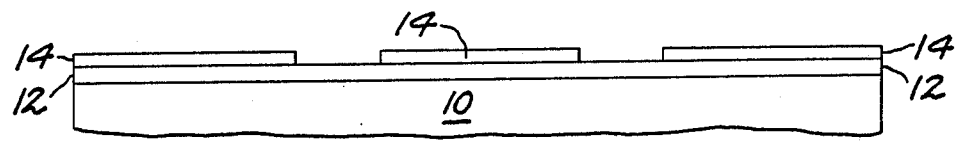
Figure 5C:
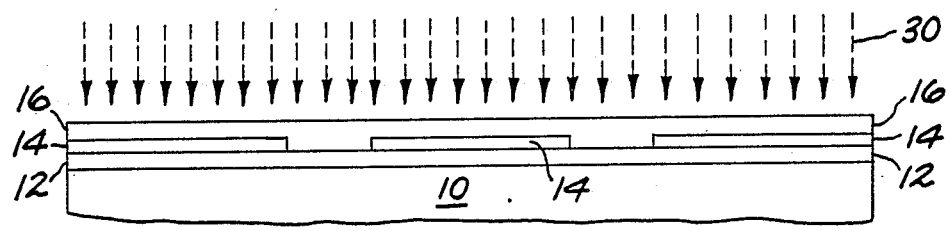
Figure 5D:
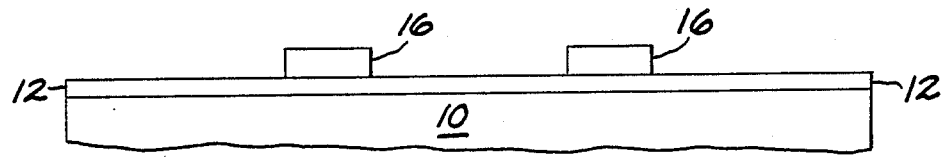

In an alternate embodiment of the present invention, a thin layer of ablatable photoabsorptive polymer material, as above, is disposed on a substrate having a conductive layer. This ablatable polymer is then patterned using a laser and mask as described above, but without the thick upper layer coating. However, the mask is patterned so as to leave ablatable polymer material present where conductive material is ultimately desired. This process has the advantage that there is significantly less debris (at least at this stage) since only a thin layer is being ablated. The substrate, with the positively patterned ablatable layer thereon is now coated with a thick layer of substantially transparent material, as above, which covers the exposed conductive layer and the patterned ablatable layer. The substrate is now exposed a second time to laser radiation, but now without a mask. The ablation of the photoablatable material then causes the thick layer to be removed everywhere except where the earlier mask based patterning step removed the ablatable material. The debris generated in this step can now be blown off or vacuumed off much more easily since there is no mask to be contaminated by the ablation process. Additionally, a larger or more powerful laser can be employed in this alternative process. Furthermore, the second laser beam need not be as collimated as the first beam since the first (masked) exposure step accurately defines the desired pattern. Debris landing on the remaining thick layer patterns, which define where conductive material will be present after etching, is significantly less of a problem since this material functions essentially only as an etching resist (for example, with respect to ferric chloride). Any upper layer debris is also made more readily removable from the conductive layer than the combination of debris from the Udel ® and Krylon ® combination. The process steps indicated above are illustrated in FIGS. 5A through 5D.

From the above, it should be appreciated that the resist configuration and method of the present invention provide a significant advantage for patterning three-dimensional parts. It is particularly seen that the system of the present invention provides a significant step forward in the utilization of moldable plastic printed circuit boards, particularly those containing structural and design elements such as channels, ridges and bosses. It is further seen that the system of the present invention provides a process for the rapid patterning of high resolution lines on desirable polymeric surfaces, even when such polymers contain fill material which contribute to surface roughness. It is further seen that the system of the present invention meets all of the aforementioned objects recited herein.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for photopatterning conductive patterns, said method comprising the steps of:
   disposing a thin layer of ablatable photoabsorptive polymer on a substrate having a conductive layer thereon, so that said polymer material is in contact with said conductive layer;
   directing a beam of laser energy on said ablatable polymer, through a mask so as to ablate said polymer layer, whereby said conductive layer is partially exposed;

disposing a thick layer of substantially transparent material over said partially ablated polymer layer and said exposed conductive layer, said photoabsorptivity and said transparency being determined with respect to the same frequency range;

directing a beam of laser energy through said thick layer so as to ablate said polymer layer and so as to simultaneously remove said thick layer above said ablated polymer layer, whereby select portions of said conductive layer are exposed.

2. The method of claim 1 in which said thin layer is selected from the group consisting of polysulfones.

3. The method of claim 1 in which said thick layer is selected from the group consisting of polymethylmethacrylate, polyethylmethacrylate and polycarbonates.

4. The method of claim 1 in which said laser energy is produced by an excimer laser.

5. The method of claim 1 in which said laser energy is in the ultraviolet frequency region.

6. The method of claim 1 in which said thin layer is between about 0.1 microns and about 10 microns in thickness.

7. The method of claim 1 in which said thick layer is between approximately 1 and approximately 100 microns in thickness.

8. The method of claim 1 further including the step of etching said finally exposed conductive layer.

9. The method of claim 8 further including the step of removing any remaining material of said thick and thin layers.

10. The method of claim 1 further including the step of depositing additional conductive layer material on the exposed portion of said conductive layer.

11. The method of claim 1 further including the step of removing said thick and thin layers.

12. The method of claim 1 in which said second laser beam exposure is performed using a higher powered laser than said first exposure.

13. The method of claim 1 in which said second laser exposure is performed without a mask.

14. The method of claim 1 in which said conductive layer comprises copper.

15. The method of claim 1 in which said mask is not in contact with said substrate.

16. The method of claim 1 in which said substrate exhibits a non-planar surface.

17. The method of claim 1 in which said substrate contains feed-through apertures.

18. The method of claim 1 further including removing said ablated material by vacuum means as it is produced.

19. The method of claim 1 further including removing said ablated material by blowing it away from the ablation side.

* * * * *